United States Patent [19]

Wright

[11] Patent Number: 5,426,339
[45] Date of Patent: Jun. 20, 1995

[54] SURFACE ACOUSTIC WAVE DEVICES WITH MODE CHANGING CHARACTERISTICS

[75] Inventor: Peter V. Wright, Dallas, Tex.

[73] Assignee: RF Monolithics, Inc., Dallas, Tex.

[21] Appl. No.: 221,853

[22] Filed: Apr. 1, 1994

[51] Int. Cl.6 .............................................. H01L 41/08
[52] U.S. Cl. ............................. 310/313 D; 310/313 B; 333/196
[58] Field of Search ........... 310/313 R, 313 B, 313 D; 333/150-155, 193-196

[56] References Cited

U.S. PATENT DOCUMENTS

| | | | |
|---|---|---|---|
| 3,987,379 | 10/1976 | De Vries | 310/313 D X |
| 3,988,703 | 10/1976 | De Vries | 310/313 D X |
| 4,072,291 | 2/1978 | Mitchell | 310/313 D X |
| 4,178,571 | 12/1979 | Mitchell | 310/313 R |
| 4,649,357 | 3/1987 | Nagai et al. | 333/196 |
| 5,010,269 | 4/1991 | Mikita et al. | 310/313 B |
| 5,296,824 | 3/1994 | Cho et al. | 333/193 |

FOREIGN PATENT DOCUMENTS

| | | |
|---|---|---|
| 2682833 | 8/1991 | France . |
| 2685580 | 12/1991 | France . |
| 3119816 | 5/1991 | Japan . |
| PCT/FR92/-00827 | 8/1992 | WIPO . |

OTHER PUBLICATIONS

Morgan, "Simplifications For Analysis Of Saw Multipole Resonators", *1993 Ultrasonics Symposium* –173.

*Primary Examiner*—Mark O. Budd
*Attorney, Agent, or Firm*—Jones, Day, Revis & Pogue

[57] ABSTRACT

A novel surface acoustic wave device that includes a multiple track transducer having a first portion for generating a transverse symmetrical mode acoustic wave and a second portion for receiving only a transverse nonsymmetrical surface acoustic wave such that substantially no direct coupling occurs between the first and second portions of the multiple track transducer and where reflector gratings are mode changing gratings that reflect the transverse symmetrical wave as a transverse nonsymmetrical wave that is received by the second portion of the multiple track transducer thereby substantially reducing undesired in-band surface acoustic wave transducer responses as well as spurious bulk responses and allowing a narrow passband to be obtained with a short structure when compared with the prior art structures.

20 Claims, 5 Drawing Sheets

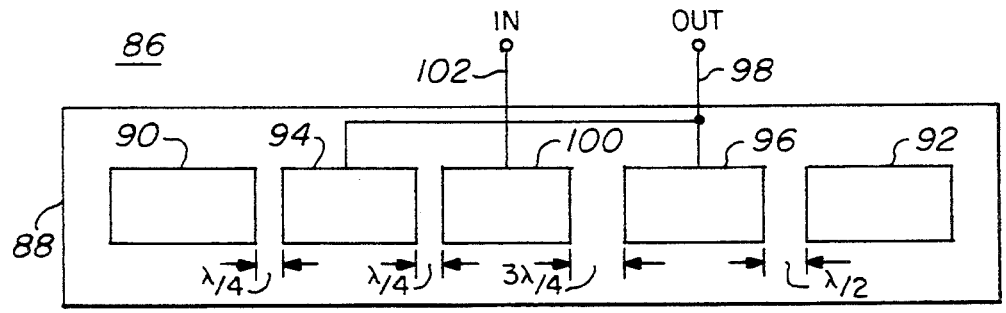
FIG. 8
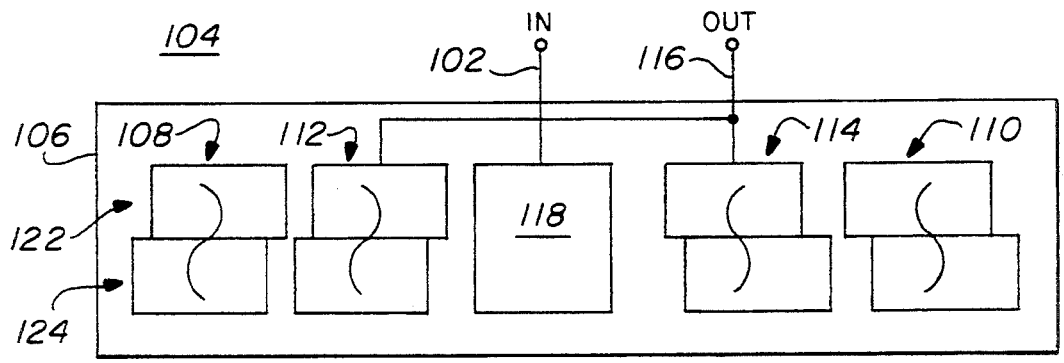
FIG. 9
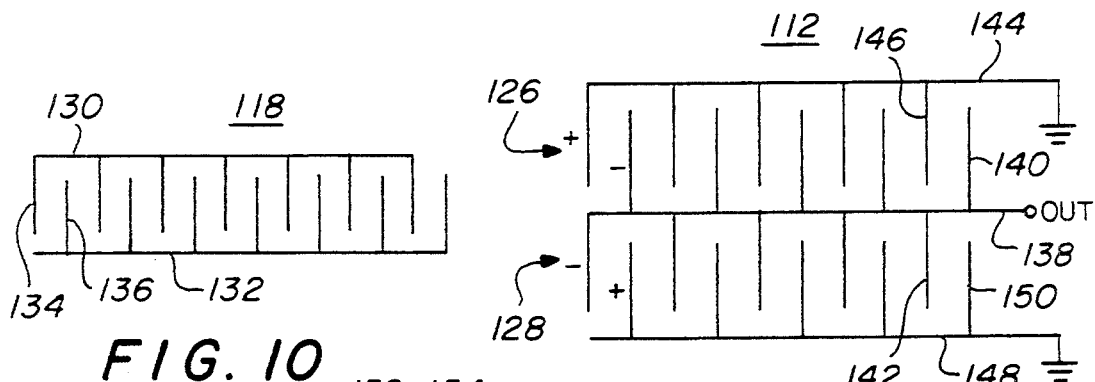
FIG. 10
FIG. 11
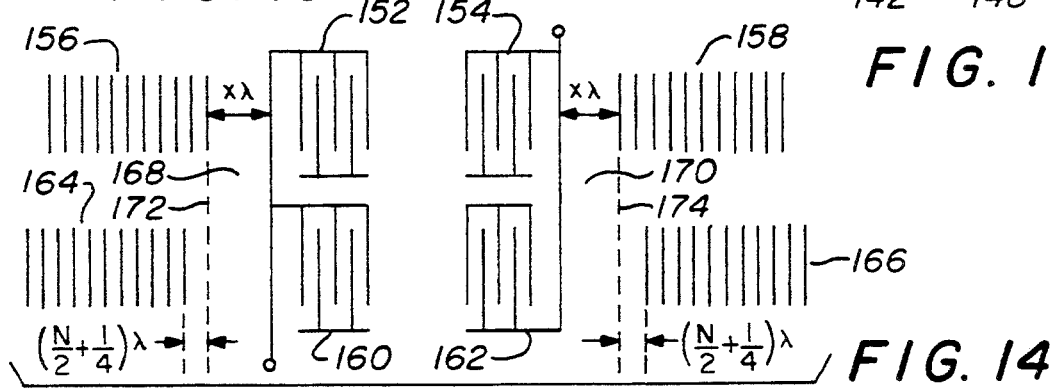
FIG. 14

SURFACE ACOUSTIC WAVE DEVICES WITH MODE CHANGING CHARACTERISTICS

BACKGROUND OF THE INVENTION

1. Field of the Invention

The present invention relates to surface acoustic wave devices in general and in particular to one embodiment of a surface acoustic wave filter that has first and second grating structures separated by first and second transducers such that a symmetric signal generated in the substrate by the first transducer is not received by the second asymmetrically constructed transducer but is reflected by asymmetric mode changing grating structures that reflect the signal asymmetrically such that it can be received by the second transducer. In a second embodiment, the invention relates to a compound filter of a given length that has a first filter section with first and second transducers separated by a first 3db grating structure, each of the first and second transducers being positioned a distance, $X\lambda$, from the first grating structure, a second filter section with third and fourth transducers separated by a second 3db grating structure, each of the third and fourth transducers being positioned a distance of $(N/2+\frac{1}{4}) \lambda$ from the second grating structure where $N \geq 1$ and is an integer. The combined output of the two independent filter sections is equivalent to the output generated by a filter section of twice the length of the compound filter and has greatly reduced side lobes in the out-of-band filter response.

2. Description of Related Art

SAW transversal filters can be constructed with excellent passband and rejection characteristics. However, the device filter length can become very large if narrow passband rejection characteristics are required. In contrast, resonant filter structures can achieve very narrow passband with stop passband rejection characteristics in a much shorter physical length. However, the ultimate out-of-band rejection of these resonant filters is generally inferior to that which can be achieved with a transversal filter structure.

The poor out-of-band rejection of a resonant-type or coupled-resonator filter is the effect of the direct coupling between the transducers. Such direct coupling causes side lobes outside the stop-band of the gratings in a (sine $X/X)^2$ function. A single resonant filter comprises two spaced in-line transducers in a cavity formed between two reflective gratings. The grating reflective responses are relatively narrow band. However, the direct coupling response between the two transducers is relatively wide with many unwanted out-of-band responses.

With present transversal filters, the output response is a function of the transduction response of the transducers plus the reflective response of the grating electrodes thus leading to the unwanted out-of-band response.

Further, in a standard prior art transversal SAW filter, the filtering function is generally achieved by varying the transduction function of the transducers. This may be accomplished in a number of ways. Finally, in the prior art, to get a narrow bandwidth, the transducer length must be very long. If the transducer is short, a wide bandwidth is obtained. Thus, the more narrow the bandwidth desired, the more space the transducer must take on the substrate because its length must be increased.

It would be advantageous to have a transverse surface acoustic wave device in which the transducers do not acoustically couple to each other except through the gratings. In such case, the output of the transducer would be the product of the transduction function of the transducer times the reflection response of the gratings and since the grating out-of-band response would be very low or near zero, the net response of the filter out-of-band would be very low. The gratings can be weighted in any well-known fashion, such as that disclosed in commonly assigned copending patent application Ser. No. 08/152,179 filed Nov. 11, 1993, and incorporated herein by reference in its entirety, to get substantially rid of any sidebands that exist. Such a device would be very low loss and compact. As stated, in the prior art, to get a narrow bandwidth, the transducers must be made very long. If the transducers are made short, a wide bandwidth is obtained. If two transducers do not acoustically couple to each other except through the gratings, the transducers can be made very short and compact and the gratings can be used to change the reflection mode or function so that the reflected signal would couple to the output transducer.

In prior art devices such as that disclosed by David P. Morgan in the 1993 Ultrasonics Symposium entitled "Simplifications for Analysis of SAW Multipole Resonators," pp. 166–172, two in-line transducers are coupled to each other only through a grating structure that has two parallel tracks with a $\lambda/4$ longitudinal separation of adjacent parallel tracks. Such structure causes a mode conversion from a transverse symmetrical wave to a transverse asymmetric wave that is received by the output transducer. It would be advantageous if such structure could be improved to further decrease the magnitude of the side lobes that are on either side of the center frequency.

Further in U.S. Pat. No. 4,178,571, an acoustic wave resonator is disclosed having first and second reflector grating structures separated by spaced first and second transducers and wherein acoustically coupled cavities between the first and second transducers and their respective grating structures are split into staggered pairs such that the first pair of cavities has a length $X\lambda$ and the second pair of cavities has a length of $X+\lambda/4$. This allows mode conversion by suppressing the response of the output transducer to acoustic waves received directly from the input transducer and receiving the acoustic wave reflected by the grating structure.

In French Patent No. 2,682,833, a similar acoustic wave structure is disclosed as a filter in which first and second transducer structures are separated by a grating structure and wherein, again, acoustically coupled cavities between grating structures and each of the transducers are split into staggered pairs such that the first pair of cavities has a length of $X\lambda$ and the second pair of cavities has a length of $X+\lambda/4$. Mode conversion is again allowed for the reasons given earlier.

A similar construction is shown in PCT Application No. PCT/FR92/00827.

SUMMARY OF THE INVENTION

Thus, the present invention relates to a multiple track transverse surface acoustic wave device formed on a piezoelectric substrate in which there is no direct signal coupling between input and output transducers in the passband and coupling occurs only through the gratings. Since the grating response out of the passband is very low or near zero, and since the only time an input and an output transducer could communicate with each other would be by means of a grating structure, the net response of the novel filter out-of-band is very low. More simply, the transducers do not communicate signals with each other directly and the grating structures substantially do not reflect signals out of the passband but cause only indirect coupling between the transducers in the passband. Also, the transducers can be made very short with low loss. The net result is that the novel filters substantially reduce or eliminate high out-of-band coupling or spurious responses that are close to the center frequency and caused by the transducers. Further, the transducer can be made very compact. Thus, the present invention gets rid of undesired out-of-band surface acoustic wave signal responses as well as spurious bulk responses with the use of a short structure.

The present invention also relates either to a multiple track in-line or a longitudinal surface acoustic wave device in which transversely positioned parallel and longitudinally spaced, in-line transducers are coupled to each other only through a grating structure that also has two parallel tracks in line with the transducers and in which one of the parallel track gratings and its associated in-line transducer has a longitudinal separation equal to $X\lambda$ and wherein the other parallel track grating and its associated in-line has the longitudinal separation of the one grating and in-line transducer in the adjacent track of $X\lambda$ plus $(N/2+\frac{1}{4})$ $\lambda$ where $N \geq 1$, and is an integer thus providing a mode converter system in which a symmetrically generated wave may be converted to an unsymmetrical wave or vice versa. Thus in a first case, one of the parallel transversely positioned transducers can be moved longitudinally with respect to the other or, in a second case, one of the parallel transversely positioned gratings can be moved longitudinally with respect to the other but in both cases, the distance moved in addition to the original distance, $X\lambda$, is $(N/2+\frac{1}{4})$ $\lambda$ where $N \geq 1$ and is an integer. In such cases, the side lobes of the output signal can be selectively reduced by the judicious selection of N for a given frequency.

The invention also relates to a compound filter in which a first filter section has first and second transducers separated by a first reflector grating and having cavity lengths of $X\lambda$ and a second filter section has third and fourth transducers separated by a second reflector grating and having cavity lengths of $(N/2+\frac{1}{4})$ $\lambda$ where $N \geq 1$ and is an integer to provide a filter having an improved frequency response.

The invention also relates to a mode converter in which two parallel grating structures are separated longitudinally from each other by a distance $d = (N/2+\frac{1}{4})$ $\lambda$ where $N \geq 1$.

Thus, it is an object of the present invention to provide a surface acoustic wave device that substantially eliminates undesired out-of-band surface acoustic wave responses and spurious bulk responses with the use of a short structure.

Further, it is an object of the present invention to provide a transverse surface acoustic wave device where there is substantially no direct signal communication or coupling between input and output transducers at any time.

It is still another object of the present invention to eliminate substantially the $(\text{sine } X/X)^2$ function generated by the direct communication between surface acoustic wave transducers and generate an output that reflects only the grating function in which the low level sidebands thereof can be further suppressed through any well-known type of weighting of the grating electrodes.

It is also another object of the present invention to provide a filter structure that is extremely compact because the product of the grating response and the transducer response is used as the output instead of the sum of the grating response and the transducer response as is done in the prior art.

It is yet another object of the present invention to provide a surface acoustic wave device that substantially reduces or eliminates high out-of-band responses that are close to the center frequency by substantially eliminating the $(\text{sine } X/X)^2$ function of the transducers.

It is a further object of the present invention to provide a filter structure that uses an in-line parallel transducer and spaced parallel grating structure that reduces undesired out-of-band responses by spacing one of the parallel transducers and the corresponding in-line parallel grating structure an amount $(N/2+\frac{1}{4})$ $\lambda$ greater than the spacing between the other parallel transducer and its corresponding in-line grating where $N \geq 1$ and N is an integer.

It is also an object of the present invention to provide a compound filter structure having two independent filter sections each using two spaced in-line transducers separated by a reflector grating and having cavities that differ in length by $(N/2+\frac{1}{4})$ $\lambda$ where $N \geq 1$ and is an integer.

Thus, the present invention relates to a SAW filter on a piezoelectric substrate comprising first and second transducers transversely spaced with respect to each other and constructed on the substrate such that a symmetric surface acoustic wave generated by the first transducer will not be substantially directly received by the second transducer, and at least one spaced grating reflector structure on the substrate constructed to convert a received symmetrical wave to a reflected nonsymmetrical wave such that the second transducer will receive substantially only the reflected nonsymmetrical surface acoustic wave generated by the reflector grating.

The invention also relates to an in-line SAW device for reducing the side lobes in which a first transducer generates a transverse symmetrical acoustic wave, a second spaced, in-line transducer receives only a nonsymmetrical acoustic wave and a mode converter for converting the symmetrical acoustic wave to a nonsymmetrical acoustic wave, the mode converter comprising a first set of electrode fingers and a second set of electrode fingers parallel to, in opposed transverse relationship with, and longitudinally spaced from the first set of electrode fingers by a distance, $d = (N/2+\frac{1}{4})\lambda$ where N is an integer $\geq 1$.

The invention further relates to a mode converter for a SAW device for effecting a mode conversion between a symmetrical and a nonsymmetrical acoustic waveform where the mode converter comprises a first set of electrode fingers, and a second set of electrode fingers parallel to, in opposed, transverse relationship with, and longitudinally spaced from, the first set of electrode fingers by a distance, $d = (N/2+\frac{1}{4})$ $\lambda$ where N is an integer $\geq 1$.

The invention also relates to a SAW filter on a piezoelectric substrate comprising first and second pairs of parallel, transversely spaced transducers, each pair of transducers being spaced in-line from the other pair on the substrate such that a symmetric surface acoustic wave generated by a first pair of said transducers will not be substantially directly received by the second pair of transducers and a first and a second pair of longitudinal spaced grating structures separated in-line by the first and second pair of parallel, transversely spaced transducers by a distance, $X\lambda$, with a corresponding grating of each said pair of longitudinally spaced gratings being spaced from its adjacent in-line transducer by an additional distance of $(N/2+\frac{1}{4})\lambda$ where $N \geq 1$ and is an integer.

The invention also relates to a compound filter structure having two independent filter sections on either separate or common piezoelectric substrates, each filter section using two spaced in-line transducers separated by a reflector grating and having cavities in the first independent filter section that differs in length by the cavity sections of the second independent filter section by $(N/2+\frac{1}{4})\lambda$ where $N \geq 1$ and is an integer.

BRIEF DESCRIPTION OF THE DRAWINGS

These and other features of the present invention will be more fully disclosed in the following DETAILED DESCRIPTION OF THE DRAWINGS in which like numerals represent like elements and in which:

FIG. 8 is a block diagram representation of a three-transducer single-channel or longitudinal SAW device of the present invention;

FIG. 9 is a block diagram of a three-transducer dual-track longitudinal type SAW device of the present invention;

FIG. 10 illustrates a typical transducer construction for the input transducer of FIG. 4 that generates a symmetrical waveform;

FIG. 11 is a schematic representation of the output transducer of the invention illustrated in FIG. 9 in which symmetrical waves are not received and which does receive substantially only nonsymmetrical waves;

FIG. 14 is an illustrative drawing in which two pair of in-line, transversely spaced, grating structures are separated by first and second longitudinally spaced pairs of transversely spaced transducers by a distance, $X)\lambda$, and in which one grating structure of each one of said in-line pair of grating structures is separated from its adjacent transducer by an additional distance $(N/2+\frac{1}{4})\lambda$ where $N \geq 1$ and is an integer such that the output transducer receives a wave having a symmetry opposite that generated by the input transducer.

DETAILED DESCRIPTION OF THE DRAWINGS

Figure 1:
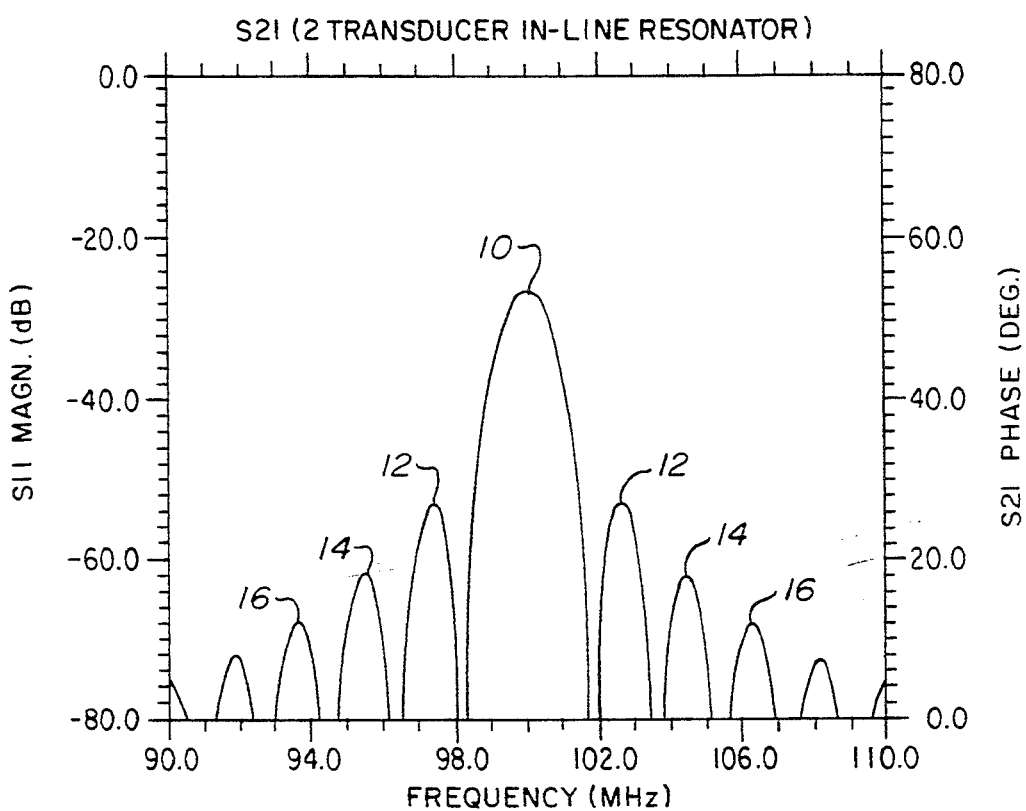
FIG. 1 is a figure representing the typical (sine $X/X)^2$ response of a two transducer filter.

FIG. 1 is a graph of a typical (sine $X/X)^2$ response of a two-transducer surface acoustic wave device illustrating the resonant peak 10 at center frequency and the sideband responses 12, 14, and 16.

Figure 2:
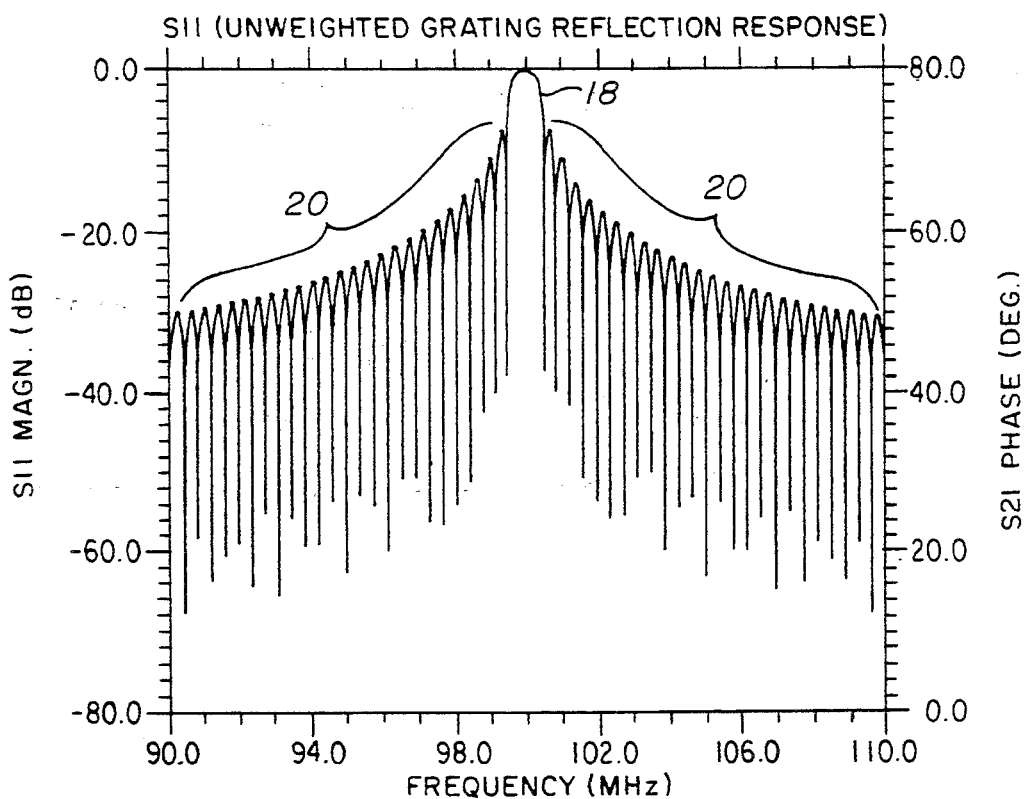
FIG. 2 is a graph illustrating the typical reflection response of an unweighted grating structure.

FIG. 2 is a graph of the typical response of an unweighted grating reflection response illustrating the main in-band peak 18 and the sidebands 20. The sidebands 20, as is well-known in the art, can be substantially eliminated by weighting of the electrodes.

Figure 3:
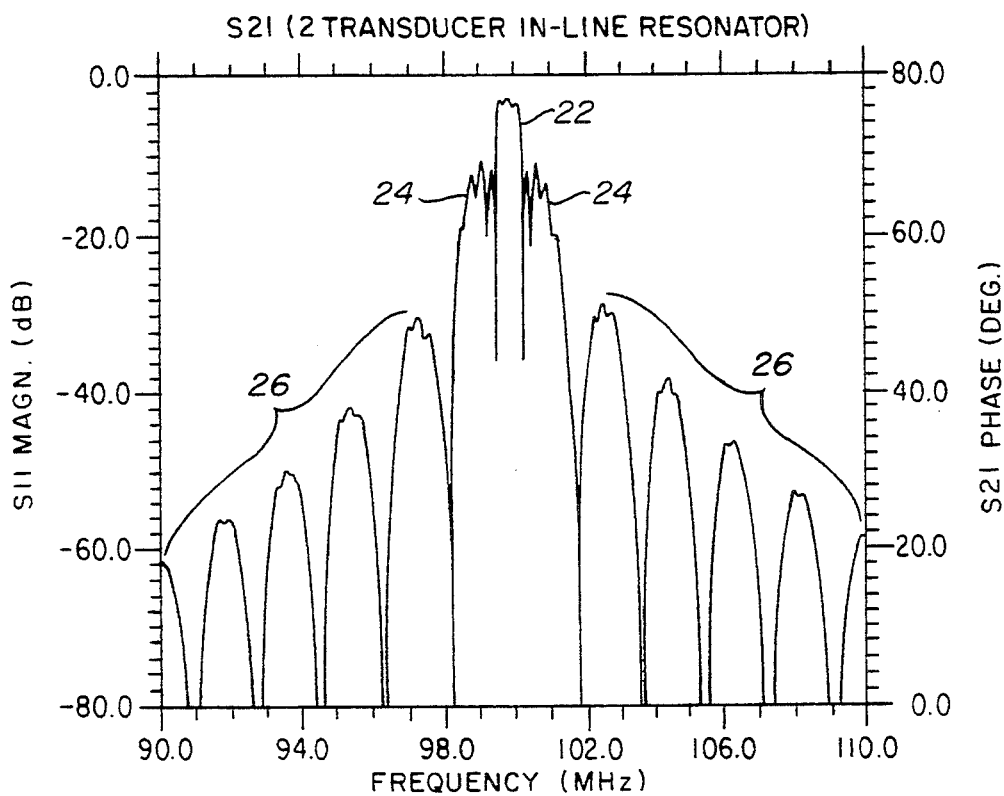
FIG. 3 is a figure representing the net response of a typical unweighted transducer sine $X/X$ response and a typical unweighted grating response.

FIG. 3 is a graph illustrating the net response of two transducers in a cavity formed between two unweighted reflective gratings. The band-pass response is centered at 22 and the side lobes 24 and a plurality of additional side lobes 26 exist because of the side lobes on the transducer responses as shown in FIG. 1 in combination with the side lobes of the grating reflections as illustrated in FIG. 2. Of course, by weighting and/or adjusting the length of the transducer, the side lobes in FIG. 3 can be reduced in magnitude.

Figure 4:
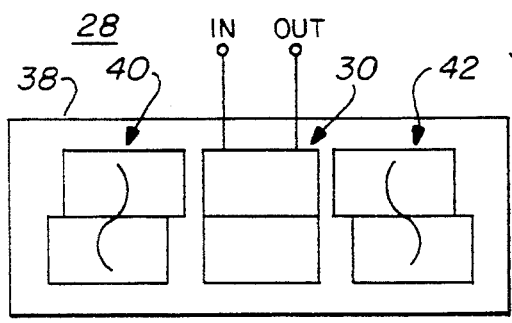
FIG. 4 is a block diagram of the present invention that utilizes a proximity or multiple track transducer having an input that generates a symmetric waveform and an output that receives only an asymmetric waveform.
Figure 5:
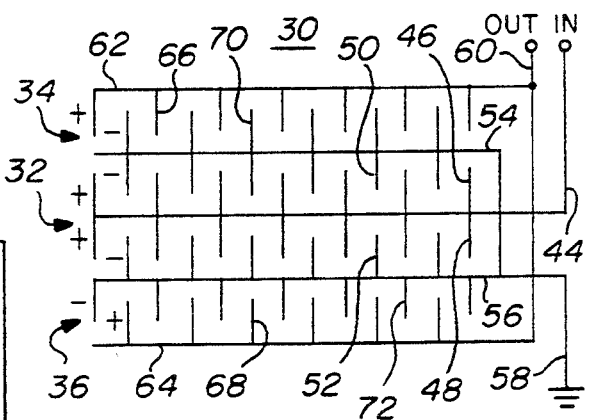
FIG. 5 illustrates the construction of the multiple track transducer of FIG. 4.

FIG. 4 is a block diagram of the preferred embodiment of the present invention which utilizes a proximity or multiple track transducer 30 (the input and output transducers are positioned on the substrate transversely of each other, or side-by-side and not in-line with each other) and is constructed as illustrated in FIG. 5, as an example only, such that a symmetric wave will be generated by the input portion 32 of transducer 30 and substantially only an asymmetric wave will be received by the output portion 34 and 36 of transducer 30. The SAW device 28 includes a piezoelectric substrate 38 on which reflector grating structures 40 and 42 are separated by the proximity transducer 30 that includes both an input portion 32 and an output portion 34 and 36 as can be seen in FIG. 5. The input transducer portion 30 generates a symmetrical wave which is not received by the asymmetrical output portions 34 and 36 but which is reflected out-of-phase by the two reflector grating structures 40 and 42 such that it is received inphase by the output portions 34 and 36 of transducer 30 and an output is generated. It is to be understood that multiple transducers, or tracks, could be placed side-by-side as an expansion of that shown in FIG. 5. Ideally, all of the transducers described in this invention are nonreflecting or reflectionless.

This can be seen more clearly with respect to FIG. 5, which illustrates the construction of the multiple track transducer. The input transducer includes an input bus 44 having electrodes 46 and 48 extending from each side thereof. They are interdigitated with electrodes 50 and 52 that are coupled to bus bars 54 and 56 respectively, both of which are grounded. Thus a signal applied between the input 44 and ground 58 generates a symmetric wave form in a well-known fashion.

However, the output bus 60 includes two bus bars 62 and 64 on opposite sides of the structure which have electrodes 66 and 68 that are 180° out-of-phase with each other. They are also interdigitated with the respective electrodes 70 and 72 of the ground bus bars from 54 and 56. Because the electrode fingers 66 and 68 are 180° out-of-phase with each other, the output terminal or bus 60 will receive only an asymmetric signal. A symmetric signal will generate cancelling voltages, since output portions 34 and 36 generate opposite polarized signals. This embodiment is extremely valuable because a very short transducer 30 can be utilized. This means, contrary to the prior art, that a narrow band-pass frequency response can be obtained with a much shorter transducer structure than that required in the prior art. It is well known in the prior art that the band-pass of a filter is inversely proportional to the length of the transducer, i.e., if the length of the transducer is doubled, the passband is halved. Further, it is also well known that the passband of a reflective grating structure is also inversely proportional to the length of the grating. However, because the reflected signal must transverse the length of the grating twice, (reflected), the band-pass of a reflective grating, when compared with a comparable length transducer structure, is approximately one-half that of the transducer. Thus in the present invention, the grating response is used to set the passband such that a comparable passband to a given prior art passband can be achieved with a much shorter filter structure because the transducer is shorter. Thus the term "shorter transducer structure" as used herein means a transducer structure that has a length less than that required in the prior art to produce an equivalent band-pass. As will be seen, there is no direct communication between the input and output transducers and since the grating structures 40 and 42 do not significantly reflect out of the passband, they essentially remove undesired out-of-band SAW responses and spurious bulk responses while being able to utilize a very short transducer structure.

Figure 6:
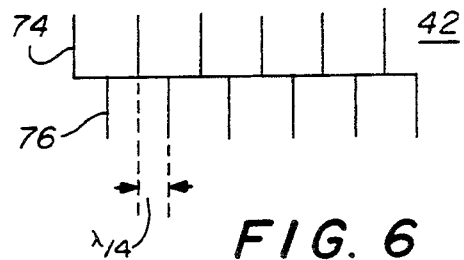
FIG. 6 is a schematic representation of a typical reflector grating that can be used in the device of FIG. 4 by converting a symmetrical mode signal to asymmetrical mode signal.

Looking at FIG. 6, a representation of the mode converter or mode changing reflector grating 40 or 42, it can be seen that when the symmetrical wave strikes electrode finger 74 generating a reflected signal, it also generates a reflected signal on electrode 76, at a given frequency, which is 180° out-of-phase with electrode 74 because of the $\lambda/4$ separation of the opposed electrodes 74 and 76. When the signal strikes electrode 76 and is reflected, it has traveled $\lambda/4$ to reach electrode 76 and $\lambda/4$ to reach electrode 74 and thus is 180° out-of-phase with the signal on electrode 74. This effect is relatively broad band in nature across the entire structure. Thus, the reflected signal then becomes asymmetric or out-of-phase and when it returns to asymmetric output transducer 40 or 42 it now engages out-of-phase electrode fingers 100, 102 and 104, 106 inphase so as to produce an output on line 60. Thus, the reflector grating 40 or 42 is a mode converter.

A much improved response of the entire filter can be obtained with an improved mode converter 40 or 42. It has been advantageously found that if the distance between grating electrode fingers 74 and 76 is modified from $\lambda/4$ to $(N/2+\frac{1}{4})\lambda$ where N=0 or is an integer equal to or greater than 1, and N is judiciously adjusted for a given frequency, F, the out-of-band response of a filter may be significantly reduced. Since the roundtrip of a reflected wave over a distance, N/2, is always a whole number, N, the desired mode conversion is always effected only by the $\lambda/4$ distance at the design frequency as explained earlier and is not changed or modified. However, at other frequencies than the design frequency where there is no mode conversion, the response of the modified mode converter 40 or 42 is significantly affected by the addition of the N/2 component to the equation above. The number of zero points within the frequency range of interest, where there is substantially no mode conversion, becomes significantly increased in the desired frequency range as the frequency increases as is well known in the SAW art and the position of those increased number of zero points can be adjusted by varying the choice of N. Thus, when the mode converter response, with the added zero points, is multiplied by the transducer response, the magnitude of the unwanted the side lobes can be significantly suppressed by the adjustment of N for a given frequency.

Figure 7:
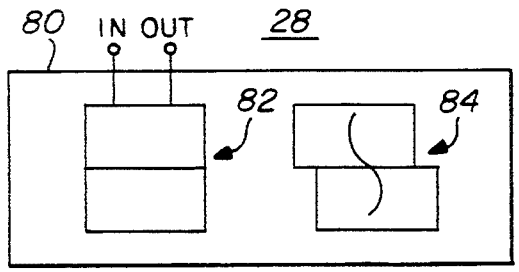
FIG. 7 is a block diagram of the present invention that uses a single-ended multiple track transducer to form the novel filter.

FIG. 7 is a schematic representation of a single-ended multiple track SAW structure for forming a filter. The device 78 includes a piezoelectric substrate 80 on which is a unidirectional transducer (UDT) 82 that operates as described with respect to FIG. 5 except that it radiates only toward grating structure 84. It may be constructed as a natural SPUDT (or NSPUDT) such as described in commonly assigned U.S. Pat. No. 4,910,839 or as a $\frac{3}{8}\lambda-\frac{3}{8}\lambda$ unidirectional structure as described in commonly assigned U.S. Pat. No. 5,073,763 or any other unidirectional structure.

Thus the transducer symmetrical wave travels substantially only toward the reflection grating 84 where it is reflected as an asymmetrical wave and travels back to the output portion of transducer 82 as described in relation to FIG. 5 and thus the filter is a low loss device with a shorter structure as described earlier. If bidirectional transducers are used, as in FIG. 4, with only one grating structure, as in FIG. 7, the device has greater insertion loss but is a shorter structure than that shown in FIG. 4.

FIG. 8 is still another embodiment of the present invention which is a three-transducer single-channel longitudinal embodiment. In this case, the device 86 again has a piezoelectric substrate 88 on which spaced reflector grating structures 90 and 92 are separated by output transducers 94 and 96 both of which are coupled to a common output terminal 98. The output transducers 94 and 96 are separated by an input transducer 100 that is coupled to an input terminal 102. Here, the construction of the output transducers 94 and 96 and the input transducer 100 are symmetrical structures similar to that illustrated in FIG. 10 while the reflector grating structures 90 and 92 are conventional symmetrical structures. It is the spacing of the transducers and the reflector gratings that create the unique properties of the device 86 in FIG. 8. Thus, for example, a spacing of $\lambda/4$ exits between input transducer 100 and output transducer 94 while a spacing of $3\lambda/4$ exists between input transducer 100 and output transducer 96. This means that a wave generated by the input transducer 100 arrives at output transducer 94 180° out-of-phase with the same signal arriving at output transducer 96. Thus the two signals cancel and there is a net output of zero on output terminal 98. It can be seen that there is no net direct communication between the input transducer 100 and the two output transducers 94 and 96 as a combined output. However, when the signal travels to the left in FIG. 8 through the quarter wavelength spacing between the input and output transducers 100 and 94, respectively, and the one-quarter wavelength between reflector grating structure 90 and output transducer 94 and then makes the return trip back to output transducer 94, it has travelled 3λ/4 distance, excluding the length of the output transducer 94. Thus such round-trip distance from the input transducer 100 to the reflector grating structure 90 and back to the output transducer 94 would 3λ/4. Going to the right in FIG. 8, the input wave from transducer 100 would travel 3λ/4, the distance to output transducer 96, λ/2 to the grating reflector structure 92, excluding the length of transducer 96 and λ/2 back to the output transducer 96 for a total distance of 7λ/4. 7λ/4−3λ/4 =4λ/4 or λ which means that the signals arrive at the output transducers 94 and 96 inphase and thus there is an output generated on output terminal 98. Thus, again, in this case, there is no net direct communication between the input transducer 100 and the two output transducers 94 and 96. The output occurs substantially only through the reflector grating structures 90 and 92. Thus, again, the side lobes caused by typical (sine X/X)² wave generation of the transducer structures are eliminated since the input and output transducers do not directly communicate and, again, the grating structures do not reflect out of the passband and therefore substantially only the product of the transducer transduction function times the reflection response of the grating represents the signal generated at the output. Any side lobes that are generated by the gratings 90 and 92 can be controlled by weighting the gratings in a well-known fashion. Again, the electrode structures can be kept very short, which is an advantage over the prior art because, as stated earlier, for a narrow band-pass in the prior art the structures have to be long. Here, again, the device uses the grating structure to determine the passband and thus the filter can be very short and still have a narrow band-pass output.

FIG. 9 is another embodiment of the invention herein similar to that shown in FIG. 8 except with dual tracks. Here, again, the device 104 is formed on a piezoelectric substrate 106 and has spaced reflector electrode structures 108 and 110 that are separated by dual-track output transducers 112 and 114, both of which are coupled to a common output terminal 116. The output transducers 112 and 114 are of the type shown in FIG. 11 in which the upper portion 126 receives a signal 180° out-of-phase with the lower portion 128. The output transducers 112 and 114 are separated by the input transducer 118 which is coupled to an input terminal 120. Here, there is no coupling in the upper track represented by arrow 122 between the input transducer 118 and the two output transducers 112 and 114 because of the spacing between those transducers as explained earlier in relation to FIG. 8. However, there is also no coupling between the input transducer 118 and the output transducers 112 and 114, respectively, in the lower track 124 for the same reason. Thus a transversely symmetric input wave from input transducer 118 simply passes under the output transducers 112 and 114 but is reflected unsymmetrically in total by the unsymmetrical reflectors 108 and 110 in the combined upper and lower tracks 122 and 124 of the reflector grating transducers 106 and 110, as explained earlier. Therefore, the unsymmetrical reflected waves are received by the unsymmetrical output transducers 112 and 114 inphase and an output signal is generated on output terminal 116. Thus, this embodiment substantially eliminates both longitudinal and transverse out-of-band distortions.

FIG. 10 illustrates the construction of the input transducer 118 in FIG. 9. It should be understood that the structure is not limited to two electrodes per wavelength but could be of any type. The input signal is coupled to bus bars 130 and 132, which have interdigitated electrode fingers 139 and 136. With this construction, symmetric waves are generated transversely in the piezoelectric substrate 106 when signals are applied to the bus bars 130 and 132. This is a standard transducer construction.

FIG. 11 illustrates the construction of either of the asymmetrical output transducer 112 or 114 in FIG. 9. Transducer 112 has an output 138 with spaced electrode fingers 140 and 142 that are 180° out-of-phase with each other. Bus bar 144, which is coupled to ground, has electrode fingers 146 that are interdigitated with electrode fingers 140 on output bus 138. Grounded bus bar 148 has spaced electrode fingers 150 that are interdigitated with the electrode fingers 142 on output bus 138. It will be noted that the electrode fingers 150 of grounded bus 148 are 180° out-of-phase with electrode fingers 146 of grounded bus 144. Thus when a symmetric wave generated by the input transducer 118 in FIG. 9 strikes the electrode fingers 140, 142, 146, and 150, they generate signals that are 180° out-of-phase with each other and therefore the net output on line 138 is zero. Consider, for example, the first two electrodes on each side of the output 138. When the symmetric signal strikes electrode 146, it generates a positive signal on electrode 146 and therefore a negative signal on adjacent electrode 140. Since electrode 140 is electrically coupled to electrode 142 on the lower side of the transducer 112, a negative signal will be generated there also. This means that a positive signal will be generated on the adjacent electrode 150. It can be seen then that the signals generated on each side of the output line 130 are 180° out-of-phase with each other and therefore cancel. Thus, there is no net output signal on line 130. This means that the electrode fingers of output transducer 112 effectively do not "see" the symmetric signal generated by the input transducer 118. The signal simply passes under transducer 112 with no effect whatsoever. However, when it strikes the electrodes of reflector grating structures 108 and 110, the symmetric wave is converted to an asymmetric wave as explained earlier and which, when received by the output transducer, is now inphase and an output signal is generated.

Figure 12:
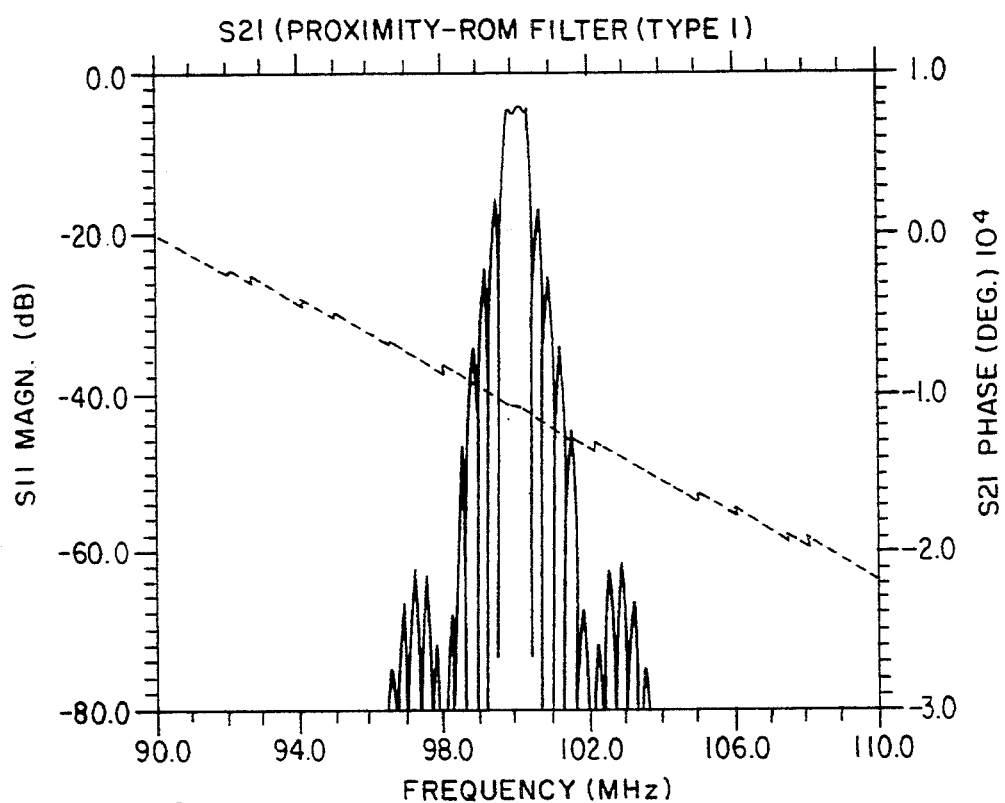
FIG. 12 is a graph illustrating the output response of the proximity filter of the type illustrated in FIG. 4.

FIG. 12 is a graph illustrating the output of the preferred embodiment utilizing the proximity input and output transducers illustrated in FIG. 4. Note the narrow passband and the reduced side lobes. Further, the side lobes as shown can be additionally reduced in magnitude by weighting of the reflector electrode structure in any well-known manner.

Figure 13:
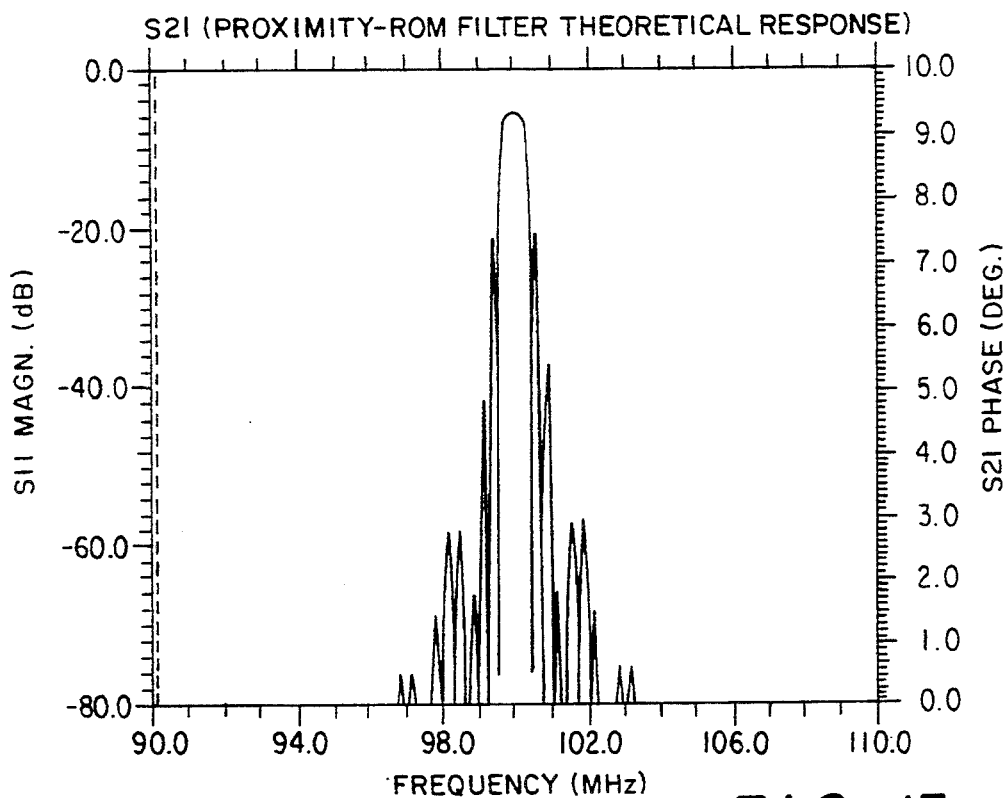
FIG. 13 is a graph illustrating the output response of the single-ended proximity filter of the type illustrated in FIG. 7.

FIG. 13 is a graph illustrating the output of the single-ended embodiment shown in FIG. 7 using a SPUDT as explained earlier.

Prior art in-line devices can be modified as shown in FIG. 14 where the first transducers 152,154 and mode converters 156,158 and second transducers 160 and 162 and mode converters 164 and 166 are in respective longitudinal alignment with each other, and the longitudinal distance between adjacent transverse electrode fingers is λ/4 as explained previously. However, by using the improved mode converter in such a device as shown in FIG. 14, an improved response of the device can be obtained by modifying the cavity distance, $X\lambda$, between each of the second transducers 160, 162 and their respective adjacent gratings 164 and 166 by adding a distance of $(N/2+\frac{1}{4})\lambda$ to each cavity 168 and 170 where $N \geq 1$ and is an integer. This added distance can be achieved by longitudinally spacing the electrode fingers of the transverse gratings 156, 168 and 158, 166 as shown in FIG. 14 or by leaving the grating electrode fingers of the adjacent grating structures 156–164 and 158–166 parallel as shown by the dashed lines 172 and 174 and moving the transducers 160 and 162 the same distance towards each other. The operation of the device is improved for the same reasons given above with respect to the explanation of FIG. 6.

Figure 15:
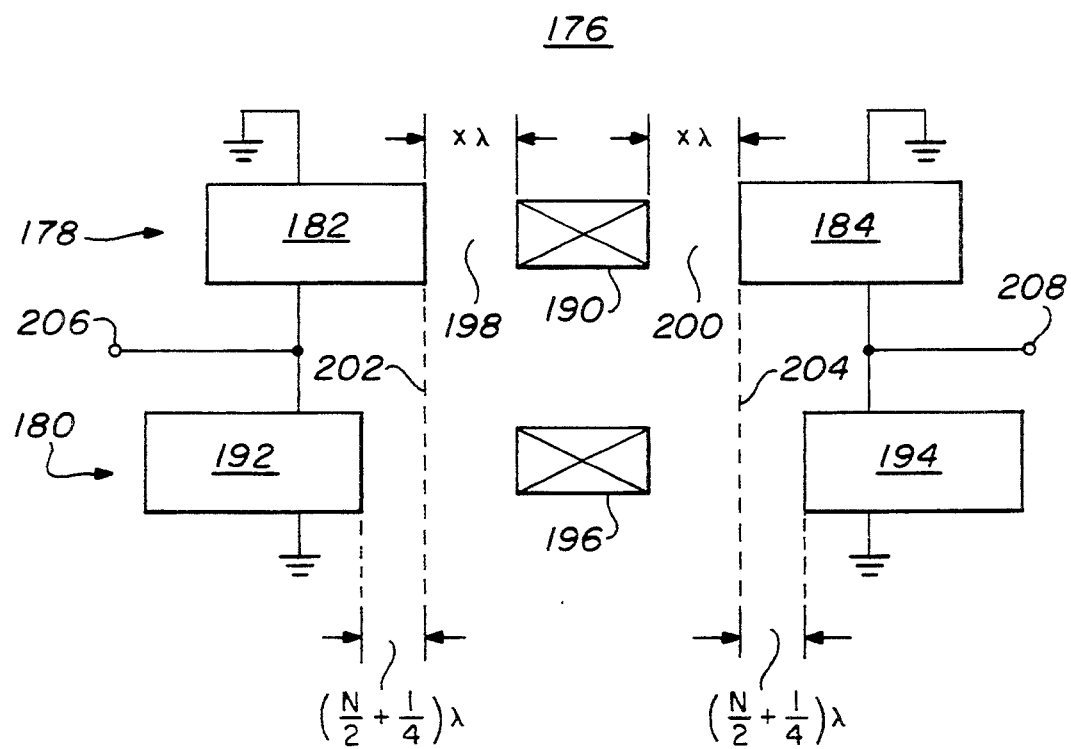
FIG. 15 illustrates a compound filter structure of the present invention that has two independent filter sections that can be placed on separate or the same substrate, each independent filter section using two spaced in-line transducers separated by a reflector grating and wherein the cavity lengths in the first independent filter section differ from the cavity lengths in the second independent filter section by $(N/2+\frac{1}{4})\lambda$ where $N \geq 1$ and is an integer.

FIG. 15 is a schematic representation of a compound filter structure that advantageously uses the improvement of the present invention. The compound filter structure 176 includes a first independent filter section 178 and a second independent filter section 180. The term "independent" as used herein means a filter section that can be placed on a piezoelectric substrate by itself or can be combined on a single piezoelectric substrate with a second independent filter section. Thus in FIG. 15, the entire structure as shown may be placed on a common piezoelectric substrate or each of the in-line filter sections 178 and 180 of the compound filter structure 176 may be placed on its own substrate. There is no practical reason why they could not be put on separate substrates except for the convenience of using a common piezoelectric substrate.

Independent filter section 178 comprises transducers 182 and 184 that are separated by a reflector grating structure 190. The cavity lengths 198 and 200 between each transducer 182 and 184 and the grating reflector structure 190 is $X\lambda$. The second independent filter section 180 also comprises first and second spaced transducers 192 and 194 separated by a reflector grating 196. The cavities 202 and 204 between each of the transducers 192 and 194 and the reflector grating structure 196 is a distance of $X\lambda + (N/2+\frac{1}{4})\lambda$. The inputs to transducers 182 and 192 are coupled to a common input terminal 206 while the outputs of transducers 184 and 194 are coupled to a common output terminal 208. This device has all of the advantages previously described with reference to the invention herein.

Thus, there has been disclosed a novel surface acoustic wave device that can be used with a transducer having any arrangement of electrodes, not just two electrodes per wavelength, that eliminates undesired out-of-band surface acoustic wave responses and spurious bulk responses while utilizing a relatively short structure compared to the prior art structures. In these devices, the input and output transducers do not directly communicate with each other within the passband and in which the gratings do not reflect out-of-passband signals thus eliminating any distortions from the gratings in the out-of-passband area. The output is, effectively, the transducer response times the grating response which substantially reduces the side lobes in both magnitude and quantity. The gratings may be weighted to achieve the passband shape as desired and frequency as desired. Thus the input and output transducers communicate with each other substantially only through the gratings and only in the passband.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. A surface acoustic wave device formed on a piezoelectric substrate, the surface acoustic wave device comprising:
   a multiple track transducer having a first portion constructed for generating only a transverse symmetric mode surface acoustic wave in the piezoelectric substrate and a second portion transversely positioned on the substrate with respect to the first portion for receiving only a transverse asymmetric mode surface acoustic wave in the piezoelectric substrate such that a transverse symmetric acoustic wave generated by the first portion will not be substantially directly received by the second portion thereby eliminating direct transducer in-band and out-of-band responses to the transverse symmetric wave; and
   at least one surface acoustic wave reflector structure longitudinally spaced from said multiple track transducer and constructed to change a transverse symmetric surface acoustic wave to a transverse asymmetric wave such that an incident transverse symmetric wave from the first portion of the multiple track transducer will be reflected as a transverse asymmetric wave that is received by the second portion of the multiple track transducer thereby generating in-band responses caused substantially only by the at least one acoustic wave reflector structure.

2. A surface acoustic wave device as in claim 1 where the first portion of the multiple track transducer is a unidirectional transducer (UDT) radiating the acoustic wave substantially only in the direction of at least one surface acoustic wave reflector structure.

3. A surface acoustic wave device as in claim 2 where the first portion of the multiple track transducer is a single-phase unidirectional transducer (SPUDT).

4. A surface acoustic wave device as in claim 1 wherein said at least one surface acoustic wave reflector structure further comprises:
   a first acoustic wave reflector longitudinally spaced from one side of the multiple track transducer and constructed to convert said transverse symmetric wave radiated in its direction to a first transverse asymmetric wave to be received substantially only by the second portion of the multiple track transducer; and
   a second acoustic wave reflector longitudinally spaced the other side of the multiple track transducer and constructed to convert said transverse symmetric wave radiated in its direction to a second transverse asymmetric wave to be received substantially only by the second portion of the multiple track transducer inphase with the first transverse asymmetric wave to generate an output.

5. A surface acoustic wave device as in claim 4 wherein each of the first and second acoustic wave reflectors comprises:
   a first set of electrode fingers; and
   a second set of electrode fingers parallel to, in opposed transverse relationship with, and longitudinally spaced from the first set of electrode fingers by a distance of $(N/2+\frac{1}{4})\lambda$ where $N=0$ or an integer equal to or greater than 1.

6. A surface acoustic wave device as in claim 1 wherein said multiple track transducer is reflectionless.

7. A surface acoustic wave device as in claim 1 wherein the first multiple track transducer comprises:
- a first set of electrode fingers having first and second opposed ends; said first set of electrode fingers adjusted to receive an input signal
- a second set of electrode fingers having first and second ends, the first end of the second set of electrode fingers being interdigitated with the first end of the first set of electrode fingers;
- a third set of electrode fingers having first and second opposed ends 180° out-of-phase with each other, the first end of said third set of electrode fingers being interdigitated with the second end of the first set of electrode fingers and electrically connected to the second set of electrode fingers, the first, second, and third sets of electrode fingers forming the first portion of the multiple track transducer for generating a transverse symmetric acoustic wave form;
- a fourth set of electrode fingers interdigitated with the second ends of the second set of electrode fingers in electrical phase with the first set of electrode fingers; and
- a fifth set of electrode fingers interdigitated with the second end of the third set of electrode fingers $\lambda/2$ out-of-phase with the first set of electrode fingers and electrically connected to the fourth set of electrode fingers, the second, third, fourth, and fifth sets of electrode fingers forming the second portion of the multiple track transducer receiving only transverse asymmetric acoustic wave forms.

8. A surface acoustic wave device as in claim 7 wherein said at least one acoustic wave reflector comprises:
- a first acoustic wave reflector in longitudinal alignment with and on one side of the multiple track transducer; and
- a second acoustic wave reflector in longitudinal alignment with and on the other side of the multiple track transducer.

9. A surface acoustic wave device formed on a piezoelectric substrate and comprising:
- an input transducer constructed for generating a surface acoustic wave in the piezoelectric substrate;
- spaced first and second acoustic wave reflector grating structures separated by the input transducer;
- a first output transducer being positioned between the input transducer and the first acoustic wave reflector grating structure; and
- a second output transducer being positioned between the input transducer and the second acoustic wave reflector grating structure and electrically coupled to said first output transducer, the spacing of the first and second output transducers with respect to the input transducer being such that directly received surface acoustic waves by said first output transducer from the input transducer cancel waves directly received by the second output transducer from the input transducer.

10. A surface acoustic wave device as in claim 9 wherein each of the first and second acoustic wave reflector grating structures further comprises:
- first and second grating devices separated by said first and second output transducers and spaced therefrom such that a surface acoustic wave generated by the input transducer is reflected from the first and second grating devices to their respective first and second output transducers inphase thus generating an output signal.

11. A surface acoustic wave device as in claim 10 wherein each of the first and second output transducers comprises:
- a first set of electrode fingers; and
- a second set of electrode fingers interdigitated with the first set of electrode fingers such that an acoustic wave directly received from the input transducer by the first output transducer cancels a acoustic wave directly received by the second output transducer from the input transducer and such that a reflected acoustic wave received by the first output transducer from the first grating device is inphase with a reflected acoustic wave received by the second output transducer from the second grating device to generate an output signal.

12. A surface acoustic wave device as in claim 9 wherein said input and output transducers are reflectionless.

13. A surface acoustic wave device formed on a piezoelectric substrate and comprising:
- an input transducer on the substrate for generating transverse symmetrical acoustic waves in the substrate;
- first and second reflector grating structures on the substrate separated by the input transducer, each of the first and second reflector grating structures being constructed with first and second parallel transverse portions with a longitudinal separation, d, where $d=(N/2+\frac{1}{4})\lambda$ and $N=0$ or is a integer equal to or greater than 1 to convert a transverse symmetrical acoustic wave received from the input transducer to a reflected nonsymmetrical transverse acoustic wave;
- a first output transducer being positioned between the input transducer and the first reflector grating structure;
- a second output transducer being positioned between the input transducer and the second reflector grating structure;
- said first and second output transducers being electrically connected to a common output terminal, and each being constructed with first and second transverse parallel portions having said separation, d, to receive a nonsymmetrical transverse acoustic wave;
- said first and second portions of said first and second output transducer being longitudinally spaced from said input transducer and said first and second reflector grating structures respectively such that an acoustic wave transmitted directly to the first and second output transducers from the input transducer is cancelled both transversely and longitudinally; and
- reflected acoustic waves received by the first and second output transducers from the reflector grating structure are inphase and generate an output signal.

14. A device as on claim 13 wherein each of the first and second output transducers comprises:
- a first set of electrode fingers; and
- a second set of electrode fingers interdigitated with the first set of electrode fingers such that a symmetrical transverse acoustic wave received directly from the input transducer by the first output transducer cancels a symmetrical transverse acoustic wave received directly from the input transducer by the second output transducer and such that a reflected nonsymmetrical acoustic wave received by the first output transducer from the first grating structure is inphase with a nonsymmetrical reflected acoustic wave received by the second output transducer from the second grating structure to generate said output signal.

15. A device as in claim 13 wherein all of said transducers are reflectionless.

16. A device as in claim 1 wherein said at least one surface acoustic wave reflector structure comprises:
   a first set of electrode fingers; and
   a second set of electrode fingers parallel to, in transverse relationship with, and longitudinally spaced from the first set of electrode fingers by a distance, $d=(N/2+\frac{1}{4})\lambda$ where $N=0$ or is an integer equal to or greater than 1.

17. A surface acoustic wave device formed on a piezoelectric substrate and comprising:
   a first transducer for generating only transversely symmetrical acoustic waves;
   a second transducer spaced from said first transducer and constructed to receive substantially only asymmetric surface acoustic waves; and
   at least one mode converter associated with said first and second transducers for converting the symmetric acoustic wave generated by said first transducer in a piezoelectric substrate to an asymmetric acoustic wave that is reflected to and received by said second transducer and having a first set of electrode fingers and a second set of electrode fingers parallel to, in opposed transverse relationship with, and longitudinally spaced from said first set of electrode fingers by a distance of $d=(N/2+\frac{1}{4})\lambda$ where $N\geq 1$ and is an integer.

18. A mode converter for converting a symmetrical mode acoustic wave in a piezoelectric substrate to an asymmetrical acoustic wave and comprising.
   a first set of electrode fingers; and
   a second set of electrode fingers parallel to, in transverse relationship with, and longitudinally offset from said first set of electrode fingers by a distance, d, where $d=(N/2+\frac{1}{4})\lambda$ where $N\geq 1$ and is an integer.

19. A surface acoustic wave device formed on a piezoelectric substrate and comprising:
   first and second spaced grating structures;
   an input transducer separating said first and second grating structures;
   an output transducer between said input transducer and said second grating structure;
   one of said input and output transducers being constructed to generate or receive only symmetric transverse acoustic waves and the other being constructed to generate or receive only asymmetric transverse acoustic waves;
   said input and output transducers and said first and second grating structures each having first and second transversely positioned parallel electrode portions;
   the first portion of both the first grating structure and the input transducer and the first portion of both the output transducer and the second grating structure each being separated by a distance $X\lambda$; and
   the second portion of both the first grating structure and the input transducer and the second portion of both the output transducer and the second grating structure each being separated by a distance $X\lambda+(N/2+\frac{1}{4})\lambda$ where $N\geq 1$ and is an integer.

20. A compound filter structure comprising:
   first and second independent filter sections;
   each independent filter section having first and second spaced in-line transducers separated by a reflector grating;
   said first in-line transducer having a cavity length between each transducer and the reflector grating of $X\lambda$;
   said second in-line transducer having a cavity length between each transducer and their respective reflector grating of $X\lambda+(N/2+\frac{1}{4})\lambda$ wherein N is an integer equal to or greater than 1; and
   a common input terminal coupled to each of the first transducers and a common output terminal coupled to each of the second transducers.

* * * * *